US012768962B2

(12) United States Patent
Palmigiani et al.

(10) Patent No.: US 12,768,962 B2
(45) Date of Patent: Oct. 20, 2026

(54) PHOTOSITE OF A DEPTH PIXEL

(71) Applicant: Commissariat à l'Énergie Atomique et aux Énergies Alternatives, Paris (FR)

(72) Inventors: Gaelle Palmigiani, Grenoble Cedex (FR); François Ayel, Grenoble Cedex (FR); Olivier Saxod, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 945 days.

(21) Appl. No.: 17/972,871

(22) Filed: Oct. 25, 2022

(65) Prior Publication Data

US 2023/0128664 A1 Apr. 27, 2023

(30) Foreign Application Priority Data

Oct. 27, 2021 (FR) ....................................... 2111424

(51) Int. Cl.

| | |
|---|---|
| ***G01B 11/22*** | (2006.01) |
| ***G01S 7/481*** | (2006.01) |
| ***G01S 7/4915*** | (2020.01) |
| *H10F 39/15* | (2025.01) |

(52) U.S. Cl.
CPC ............ *G01S 7/4915* (2013.01); *G01B 11/22* (2013.01); *G01S 7/4816* (2013.01); *H10F 39/1538* (2025.01)

(58) Field of Classification Search
CPC ......... G01B 11/22; G01S 17/10; G01S 17/89; G01S 7/4816; G01S 7/4915; H10F 39/1538; H10F 39/803
See application file for complete search history.

(56) References Cited

U.S. PATENT DOCUMENTS

| | | | |
|---|---|---|---|
| 2004/0043529 A1 | 3/2004 | Fossum | |
| 2008/0231737 A1* | 9/2008 | Weale | H04N 25/00 348/E3.018 |
| 2016/0181295 A1 | 6/2016 | Wan et al. | |
| 2017/0064235 A1 | 3/2017 | Wang et al. | |

OTHER PUBLICATIONS

Preliminary Search Report for French Application No. 2111424, dated Jun. 9, 2022.

* cited by examiner

*Primary Examiner* — Dani Fox
(74) *Attorney, Agent, or Firm* — Wolf, Greenfield & Sacks, P.C.

(57) ABSTRACT

The present description concerns a photosite including: a photoconversion area configured to convert light into charges; at least one assembly of a first node and of a first charge flow path including a first switch configured to allow the flowing of charges from the photoconversion area to the first node of said assembly when said first switch is on and block the passage of charges between the photoconversion area and the first node of said assembly when said first switch is off; and a second charge flow path between said photoconversion area and a second node of the photosite, wherein the first and second paths are configured so that each first path holds the priority over the second path when the first switch of said first path is on.

18 Claims, 4 Drawing Sheets

PHOTOSITE OF A DEPTH PIXEL

CROSS-REFERENCE TO RELATED APPLICATIONS

This application claims priority to French application number 2111424, filed Oct. 27, 2021. The contents of which is incorporated by reference in its entirety.

TECHNICAL BACKGROUND

The present disclosure generally concerns electronic circuits, and more particularly indirect time-of-flight sensors (iToF).

PRIOR ART

A ToF ("Time of Flight") sensor enables to acquire depth data. For this purpose, as well known by those skilled in the art, the sensor emits a light signal, generally in infrared, modulated at a frequency Fmod, towards a scene. The sensor then receives the light reflected by the scene. For each depth pixel of the sensor, the phase shift between the emitted modulated light signal and the received modulated light signal enables to obtain, or to deduce, data relative to the distance between the pixel and an element in the scene having reflected the modulated light towards this pixel.

In an indirect ToF sensor, or iToF sensor, for each depth pixel, the determination of the phase shift between the emitted and received modulated light signal is possible by the capture of at least three samples over a period of the modulated light signal, for example, three samples phase-shifted by 120° or four samples phase-shifted by 90°.

In an iToF sensor, each depth pixel may only comprise a single photosensitive region configured to convert the received light into charges, that is, into electron/hole pairs.

A depth pixel only comprising a single light photoconversion area may comprise circuits enabling, at each integration phase between two phases of reading from the sensor pixels, the acquisition of three or four phase-shifted samples which then enable to determine the phase shift between the modulated light signal emitted by the sensor and the modulated light signal received by the pixel. However, such a pixel is bulky.

To decrease the bulk, a depth pixel only comprising one light photoconversion area may comprise circuits allowing, at each integration phase, the acquisition of only part of the samples, which then enable to determine the phase shift between the modulated light signal emitted by the sensor and the modulated light signal received by pixel. In this case, a plurality of integration phases are necessary to obtain, for each pixel, all the samples enabling to determine the phase shift between the modulated light signal emitted by the sensor and the modulated light signal received by the pixel.

The depth pixels described hereabove comprise a single photosite, that is, a single association of a photoconversion area and of circuits allowing the acquisition of at least one sample per integration phase.

In an iToF sensor, each depth pixel may comprise a plurality of photosites, each photosite allowing the acquisition, at each integration phase, of at least one sample. The photosites of the pixel enable to obtain all the samples for the determination of a phase shift, in one or a plurality of integration phases.

In each depth pixel, the provision of one or a plurality of photosites, each enabling to obtain only part of the samples for the determination of a phase shift enables to decrease the size of the photosite and/or to homogenize the form factor of the photosite, to simplify its integration in an array of pixels of an iToF sensor. This is for example advantageous when the sensor array also comprises color pixels configured to obtain colorimetric information, that is, in the case of a combined iToF and color sensor (currently called RGBZ sensor), or combined iToF and black and white sensor.

SUMMARY

There is a need to overcome at least certain disadvantages of known photosites of pixels of an iToF sensor.

For example, there is a need to decrease the bulk of known photosites of pixels of an iToF sensor and/or the power consumption of these known photosites.

An embodiment provides a photosite comprising:

- a photoconversion area configured to convert light into charges;
- at least one assembly of a first node and of a first charge flow path comprising a first switch configured to allow the flowing of charges from the photoconversion area to the first node of said assembly when said first switch is on and block the passage of charges between the photoconversion area and the first node of said assembly when said first switch is off; and
- a second charge flow path between said photoconversion area and a second node of the photosite,
- wherein the first and second paths are configured so that each first path holds the priority over the second path when the first switch of said first path is on, and
- wherein the second path comprises no switch between the photoconversion area and the second node.

According to an embodiment, the second path comprises no transistor.

According to an embodiment, the second path comprises a transistor having a gate configured to receive a constant bias voltage.

According to an embodiment, the photosite comprises a single assembly of a first path and of a first node, the first and second paths being configured to transfer all the charges from the photoconversion area to the second node when the first switch is off.

According to an embodiment, the first and second paths are further configured to transfer all the charges from the photoconversion area to the first node when the first switch is on.

According to an embodiment, the photosite further comprises a readout circuit coupled to the first node.

According to an embodiment, the second node is configured to receive a potential for resetting the photoconversion area.

According to an embodiment, the photosite further comprises a readout circuit coupled to the second node.

According to an embodiment, the first node is configured to receive a potential for resetting the photoconversion area.

According to an embodiment, the photosite comprises a plurality of assemblies of a first path and of a first node, the first and second paths being configured to transfer all the charges from the photoconversion area to the second node when all the first switches are off.

According to an embodiment, the first and second paths are further configured to transfer all the charges from the photoconversion area to the first node of a given assembly when, among the first switches, only the first switch of said given assembly is on.

According to an embodiment, the photosite comprises a readout circuit coupled to each of the first nodes.

According to an embodiment, the second node is configured to receive a potential for resetting the photoconversion area.

According to an embodiment, the photoconversion area comprises a pinned photodiode.

Another embodiment provides a sensor comprising a plurality of depth pixels, each depth pixel comprising at least one photosite such as defined hereabove.

According to an embodiment, the first node or one of the first nodes of one of the photosites is connected to the first corresponding node of another one of the photosites.

According to an embodiment, the second node of one of the photosites is connected to the second node of another one of the photosites.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, in the following description, the case where, when charges (electron/hole pairs) are photogenerated in a photosensitive area, the useful photogenerated charges are the photogenerated electrons, is considered. However, those skilled in the art will be capable of adapting the description to the case where the useful photogenerated charges are the photogenerated holes, for example, by inverting the indicated conductivity types and the polarities of the described signals.

Unless indicated otherwise, in the rest of the description, the useful photogenerated charges are called photogenerated charges.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms “front”, “back”, “top”, “bottom”, “left”, “right”, etc., or to relative positional qualifiers, such as the terms “above”, “below”, “upper”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%.

Figure 1:
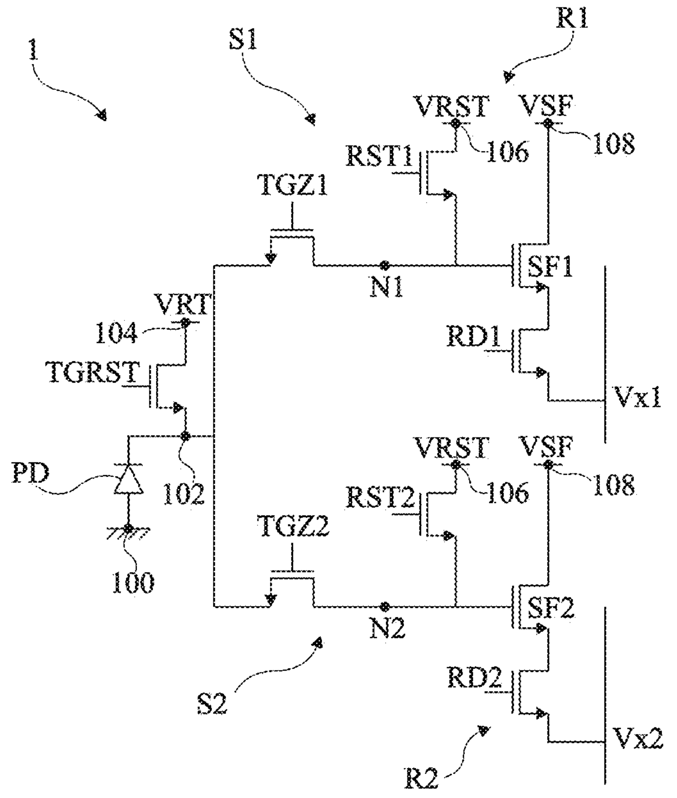
FIG. 1 shows an example of a circuit of a photosite.

FIG. 1 shows an example of a circuit of a photosite 1.

Photosite 1 comprises an area PD, for example, a photodiode, preferably a pinned photodiode, configured to receive light and to convert it into charges. For example, area PD is configured, when it receives light, to generate electron/hole pairs, and so that only the photogenerated charges of a given polarity, called useful charges, are kept in area PD, the other photogenerated charges being discharged from area PD.

Area PD is connected between a node 100 and a node 102. Area PD has a terminal or electrode, in this example its anode, coupled, preferably connected, to node 100 and has another terminal or electrode, in this example its cathode, coupled, preferably connected, to node 102. Node 100 is configured to receive a reference potential, for example, the ground. Node 102 is coupled to a node 104 configured to receive a potential VRT for resetting area PD. More particularly, area PD is coupled to node 100 by a transistor TGRST, a conduction terminal of transistor TGRST being coupled, preferably connected, to node 102, the other conduction terminal of transistor TGRST being coupled, preferably connected, to node 104. During an initialization phase, transistor TGRST is turned on to discharge the charges of area PD onto node 104. Potential VRT is for example higher than the potential Vpin of area PD, that is, the maximum photogenerated charge accumulation region potential of area PD when empty (in the absence of photogenerated charges).

Photosite 1 further comprises N assemblies Si, i being an integer index and N an integer having a value, for example, in the range from 1 to 4. In the example of FIG. 1, N is equal to 2.

N corresponds to the number of samples that the photosite can acquire at each integration phase.

Each assembly Si (S1 and S2 in FIG. 1) comprises a switch TGZi (TGZ1 and TGZ2 in FIG. 1) coupling node 102 to a node Ni (N1 and N2 in FIG. 1) of the assembly. For example, each switch TGZi is a transfer gate.

In the example of FIG. 1, photosite 1 is configured to operate in the voltage domain.

Each node Ni is then connected to a readout circuit of photosite 1. In the example of FIG. 1, this readout circuit comprises, for each assembly Si, a readout circuit Ri (R1 and R2 in FIG. 1). Each readout circuit Ri comprises, for example, a transistor RSTi (RST1 and RST2 in FIG. 1) coupling node Ni to a node 106 configured to receive a potential VRST for resetting nodes Ni. Each circuit Ri further comprises, for example, a transistor SFi (SF1 and SF2 in FIG. 1) assembled as a follower source having its gate connected to node Ni, its drain connected to a node 108 configured to receive a bias potential VSF, and its source coupled to a read line Vxi (Vx1 and Vx2 in FIG. 1), of the photosite by a readout transistor RDi (Rd1 and Rd2 in FIG. 2).

In photosite 1, outside integration phases, transistors TGZi are in the off state. Further, to avoid for area PD to totally fill with photogenerated charges, which would then overflow towards nodes Ni, transistor TGRST is held in the on state so that all the charges photogenerated in area PD are discharged to node 104.

In photosite 1, during each integration phase, transistors TGZi are set to the on state each in turn, simultaneously in all the sensor photosites, at a frequency and for a duration which are determined by frequency Fmod and by the number of samples (3 or 4) that each pixel will acquire to determine a phase shift. At each turning on of a transistor TGZi, transistor TGRST is set to the off state, so that photogenerated charges are transferred from area PD to the corresponding node Ni. Preferably, each integration phase corresponds to a plurality of settings to the on state of each of transistors TGZi. Further, when the transistors TGZi of photosite 1 are all in the off state, transistor TGRST is set to the on state to avoid for area PD to completely fill with photogenerated charges, which would the overflow towards nodes Ni.

In photosite 1, at the end of the integration phase, a sample is present on each node Ni.

During the next read phase, the samples present on the nodes Ni of photosite 1 are read via the readout circuit connected to nodes Ni. For example, node N1 is read from by circuit R1 by turning on transistor RD1 and node N2 is read from by circuit R2 by turning on transistor RD2. The two nodes N1 and N2 may be simultaneously read when line Vx1 is distinct from line Vx2, or sequentially when the lines Vx1 and Vx2 of photosite 1 are one and the same.

Figure 2:
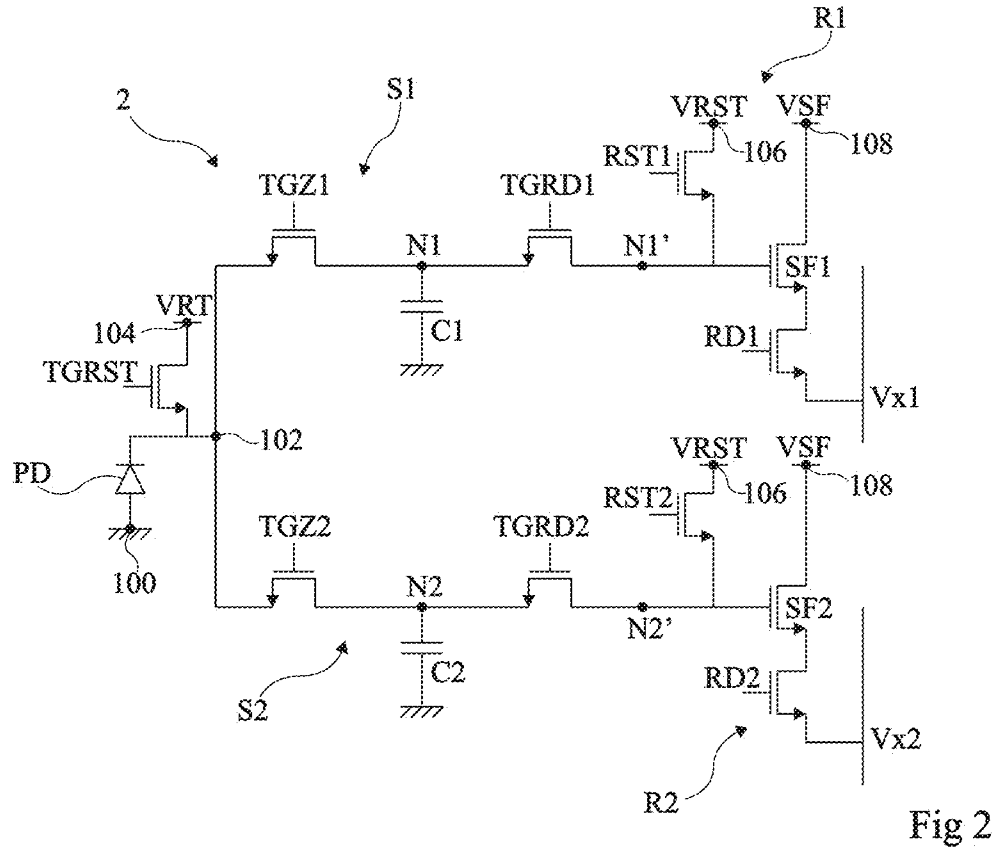
FIG. 2 shows another example of a circuit of a photosite.

FIG. 2 illustrates another example of a circuit of a photosite 2.

Photosite 2 corresponds to photosite 1 adapted to an operation in the charge domain. Only the differences of photosite 2 with respect to photosite 1 are here highlighted.

As compared with the photosite 1 described in relation with FIG. 1, the nodes Ni of assemblies Si are not directly connected to the readout circuit of the photosite. More particularly, for each assembly Si, photosite 2 comprises a transistor TGRDi (TGRD1 and TGRD2 in FIG. 2) connected between node Ni and a node N'i (N'1 and N'2 in FIG. 2). Nodes N'i are those directly connected to the readout circuit of photosite 2.

In the example of FIG. 2, the readout circuit of photosite 2 comprises, for each node N'i, a circuit Ri connected to node N'i, similarly to the way in which each circuit Ri is connected to a corresponding node Ni in FIG. 1. Thus, in this example, each node Ni may be read from by turning on the corresponding transistor TGRDi, and then by reading from node N'i due to the corresponding circuit Ri, by turning on transistor RDi. The two nodes N'1 and N'2 may be simultaneously read from when line Vx1 is distinct from line Vx2, or sequentially when the lines Vx1 and Vx2 of photosite 1 are one and the same.

In another example not illustrated, nodes N'i may be one and the same, circuits Ri then also being one and the same.

In photosite 2, as compared with photosite 1, each assembly Si comprises a capacitive element Ci (C1 and C2 in FIG. 2) connected to the corresponding node Ni. Capacitive element Ci is for example a pinned capacitive element of CDTI capacitive element type, to favor the charge transfer.

The operation of the transistors TGZi and TGRST of photosite 2 is similar to that described for photosite 1.

For a given value of N, it would be desirable to decrease the bulk of the photosites 1 and 2 described in relation with FIGS. 1 and 2.

For a given value of N, it would also be desirable to decrease the power consumption of the photosites 1 and 2 described in relation with FIGS. 1 and 2.

In particular, when the sensor is of global shutter acquisition type, these switchings are simultaneous in all the photosites of an iToF sensor, which implies using specific and complex circuits to generate the signals for controlling these switches TGZi. Further, in each photosite 1 or 2, the signal for controlling transistor TGRST has to hold this transistor TGRST in the on state when all transistors TGZi are off, and has to hold this transistor TGRST in the off state as soon as one of transistors TGZi is on. The signal for controlling transistor TGRST is thus also complex to generate and takes part in the power consumption of the photosite and, more generally, of an iToF sensor comprising such photosites.

In the previously-described photosites, there is a plurality of charge flow paths from photodiode PD to nodes, each associated with a distinct path. For example, there is:

- a charge flow path between photodiode PD and node 104, which is controllable by controlling the transistor TGRST of this flow path;
- a photogenerated charge flow path from photodiode PD to node N1, which is controllable by controlling the transistor TGZ1 of this flow path; and
- a photogenerated charge flow path from photodiode PD to node N2, which is controllable by controlling the transistor TGZ2 of this flow path.

More generally, in the previously-described photosites, each photogenerated charge flow path from area PD to a corresponding node comprises a transistor, or switch, enabling to control when charges can flow in this path and when charges cannot flow in this path.

It is here provided to decrease the bulk of a photosite and the power consumption of this photosite, by providing that at least one of the charge flow paths from area PD to a corresponding node is not controllable or, in other words, that is comprises no switch, the term switch designing here, for example, a component, for example a transistor or a gate, alternatively controlled between two different states, for example between an on state allowing for the charges to flow inside the path comprising the switch and an off state preventing for the charges to flow in this path, or for example between a first on state allowing for all the charges to flow inside the path comprising the switch and a second on state allowing for only the charges in excess in the photoconversion area PD to flow inside this path. Preferably, the flow path which is not controllable does not receive any control signal having at least two different states, oppositely to a controllable flow path which receives a control signal having at least two different states each corresponding to a different state of the controllable path. The photosite is then configured so that all the charges of the photoconversion area flow through the path comprising no switch when all the other paths are closed, that is, their switches are in the off state. Further, the photosite is also configured so that no charge flows through the path comprising no switch when any of the controllable paths is conductive, that is, the switch of this path is in the on state. In this last case, the charges flow through the conductive controllable path, which is then said to hold the priority over the non-controllable path. As an example, a flow path connects the photodiode to a node. Each flow path but one, called continuous flow path, comprises a switch capable of controlling a potential barrier for carriers photogenerated in area PD between a blocking level and a conductive level. The diode potential is intermediary between the potential of a node of the continuous flow path and all the blocking levels of the potential barriers.

Preferably, when the photosite comprises a plurality of controllable paths and the switch of any of these controllable paths is set to the on state, the switches of the other controllable paths are held in the off state and all the charges of the photoconversion area flow through the controllable path having its switch in the on state. Further, when the photosite comprises a single controllable path, all the charges of the photoconversion area flow through this controllable path when its switch is in the on state.

This enables to suppress a switch and a control signal corresponding to this switch. This thus results in a decrease in the bulk of the photosite, and a decrease in the power consumption of this photosite. Further, this simplifies the forming of an iToF sensor comprising such photosites, for example due to the fact that there is one less control signal to generate.

Figure 3:
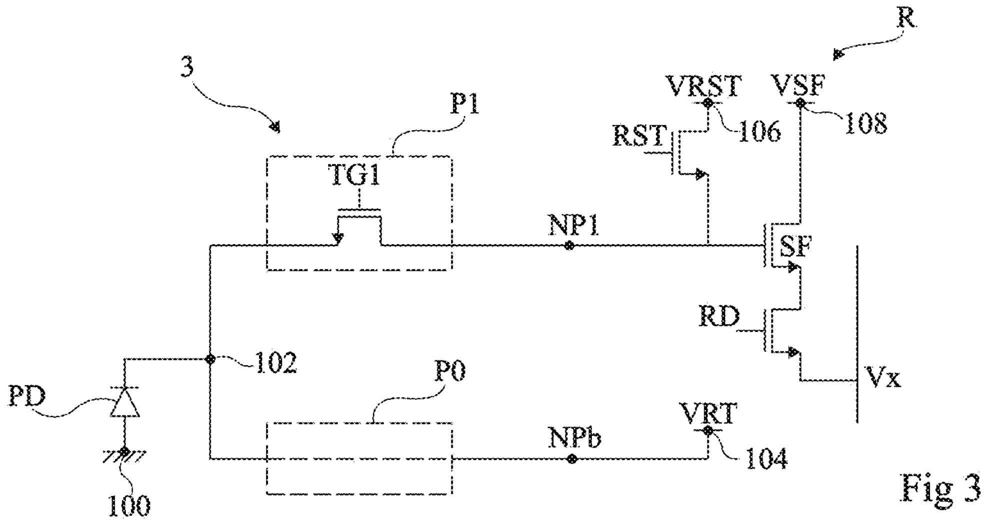
FIG. 3 shows an example of embodiment of a photosite.

FIG. 3 shows an example of embodiment of a photosite 3 such as described hereabove.

Photosite 3 comprises, like the previously-described photosites 1 and 2, area PD connected between nodes 100 and 102.

In the example of FIG. 3, photosite 3 comprises an assembly of a node NP1 and of a first charge flow path between area PD and node NP1, this first path being delimited by dotted lines and referenced as 7 in FIG. 3. Path P1 couples area PD, for example, node 102, to node NP1.

Path P1 is controllable. In other words, path P1 comprises a switch TG1, for example, a transfer gate or a MOS ("Metal Oxide Semiconductor") transistor, coupling area PD (node 102) to node NP1.

Switch TG1 is configured to allow the passage (or the flowing) of charges from area PD to node NP1 when it is on and to block the passage of charges between area PD and node NP1 when it is off.

Path P1 is unidirectional, that is, the charges taking path P1 can only flow from area PD to node NP1, but they cannot flow from node NP1 to area PD. The use of a pinned photosensitive area preferably enables to have a unidirectional electric field allowing this unidirectional flow.

Photosite 3 comprises a second charge flow path between area PD and a node NPb, delimited by dotted lines and referenced as P0 in FIG. 3. Path P0 couples area PD, for example, node 102, to node NPb.

Path P0 is not controllable. In other words, path P0 comprises no switch, the on or off state of which would condition a charge flow via this path P0.

Path P0 is unidirectional, that is, the charges taking path P0 can only flow from area PD to node NPb, but they cannot flow from node NPb to area PD. The use of a pinned photosensitive area preferably enables to have a unidirectional electric field allowing this unidirectional flow.

Paths P1 and P0 are configured so that path P1 holds the priority over path P0 when the switch TG1 of path P1 is on, that is, when path P1 is conductive.

In other words, in this example where photosite 3 comprises a single controllable path P1, paths P1 and P0 are configured so that all the charges photogenerated in area PD are transferred to node NP1 when switch TG1 is on, and to prevent any charge transfer between area PD and node NPb, via path P0, when switch TG1 is on. Further, in this example where photosite 3 comprises a single controllable path P1, paths P1 and P0 are configured so that all the charges photogenerated in area PD are transferred to node NPb when switch TG1 is off, and to prevent any charge transfer between area PD and node NP1, via path P1, when switch TG1 is off.

Still in other words, paths P1 and P0 are configured so that, when transistor TG1 is on, respectively off, the impedance of path P1 between node 102 and node NP1 is lower, respectively higher, than the impedance of path P0 between node 102 and node NPb.

In the example of FIG. 3, the priority-holding path P1 is a sampling path. In other words, path P1 is configured, when its switch TG1 is on, to sample charges photogenerated in area PD on node NP1. In this example, the path P0 which does not hold the priority is a reset path for photodiode PD. In other words, path P0 is configured, when switch TG1 is off, to empty area PD of all the photogenerated charges located therein.

Thus, in this example, node NP1 is coupled to a readout circuit R of the photosite. Further, node NPb is then coupled, preferably connected, to node 104 configured to receive potential VRT.

In the example of FIG. 3, photosite 3 is configured to operate in the voltage domain. Circuit R is then preferably connected to node NP1.

As an example, circuit R comprises a transistor SF having its gate connected to node NP1, its source coupled to a readout line Vx of photosite 3 by a transistor RD, and its drain coupled, preferably connected, to a node 108 configured to receive bias potential VSF. Further, circuit R comprises a transistor RST coupling the gate of transistor SF to a node 106 configured to receive a potential VRST for resetting node NP1.

Figure 4A:
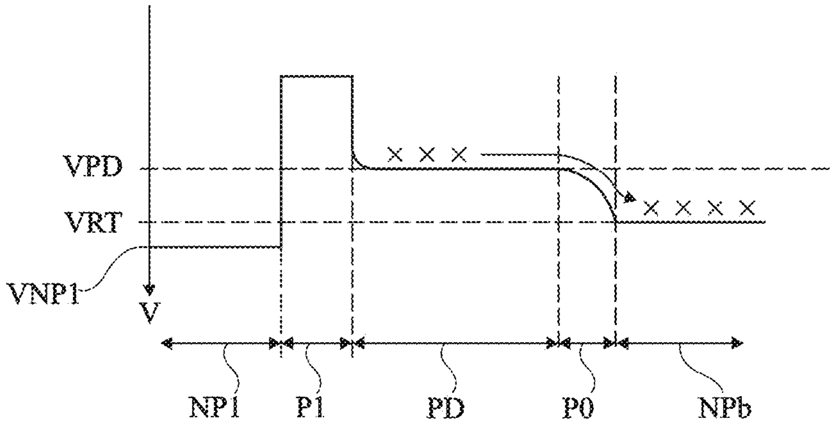
FIG. 4A illustrates an implementation mode of a first operating step of the photosite of FIG. 3.
Figure 4B:
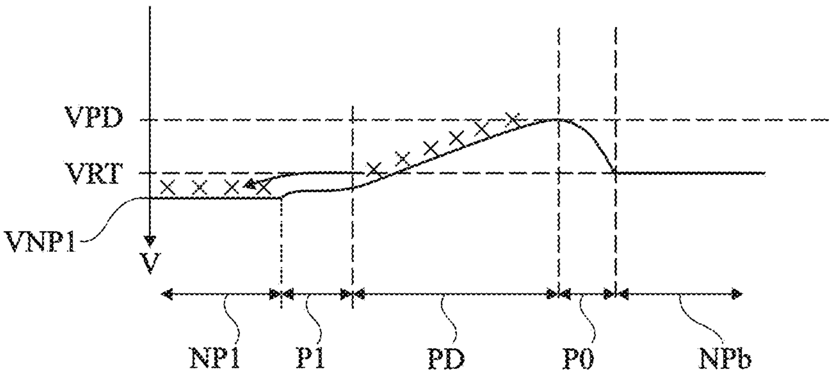
FIG. 4B illustrates an implementation mode of a second operating step of the photosite of FIG. 3.

FIGS. 4A and 4B illustrate an implementation mode of two operating steps of the photosite 3 of FIG. 3, FIG. 4B illustrating potentials in photosite 3 when path P1 is conductive (switch TG1 on) and FIG. 4A illustrating potentials V in photosite 3 when path P1 is blocked (switch TG1 off). Each of FIGS. 4A and 4B illustrates potentials of nodes NP1 and NPb, in paths P1 and P0 and in area PD. In the example of FIGS. 4A and 4B, the useful photogenerated charges are electrons.

At the step of FIG. 4A, switch TG1 is in the off state. Path P1 then corresponds to a potential barrier for the charges photogenerated in area PD, this barrier being arranged between area PD and node NP1, which is at a potential VNP1. Conversely, path P0 then corresponds to a potential gradient between the potential VPD in area PD and the potential VRT of node NPb. As a result, all the charges photogenerated in area PD, represented by crosses in FIG. 4A, flow from area PD to node NPb, by taking path P0.

At the step of FIG. 4B, switch TG1 is in the on state. Path P1 then corresponds to a potential gradient between potential VPD in area PD and the potential VNP1 of node NP1. Conversely, area P0 then forms, or corresponds to, a potential barrier between area PD and node NPb at potential VRT. As a result, all the charges photogenerated in area PD, represented by crosses in FIG. 4B, flow from area PD to node NP1, by taking path P1.

As an example, as shown in FIG. 4B, preferably photosite 3 is configured so that the switching to the on state of switch TG1 results in a potential gradient extending in area PD and path P1, from path P0 to node NP1, so that the photogenerated charges flow all the way to node NP1.

In the example of FIGS. 3, 4A and 4B, path P1 is a sampling path and path P0 is a path for resetting area PD.

In another example not illustrated, path P1 is the path for resetting area PD and path P0 is the sampling path. In other words, path P1 is configured, when its switch TG1 is on, to empty area PD of the photogenerated charges which are located therein, and path P0 is configured, when switch TG1 is off, to sample charges photogenerated in area PD on node NPb. In this other example, node NPb is then coupled, preferably connected, to the readout circuit R of photosite 3 and node NP1 is coupled, preferably connected, to node 104 configured to receive potential VRT.

An advantage of photosite 3 over a photosite 1 or 2 where N would be equal to 1 is that it requires one less control signal, due to the fact that it does not comprise switch TGRST. Further, path P0 is then less bulky to implement than the switch TGRST of photosites 1 and 2.

Those skilled in the art are capable of implementing the paths P1 and P0 of photosite 3 to obtain the above-described operation.

For example, those skilled in the art are capable of providing a photosite 3 where all the charges photogenerated in area PD are conveyed to a portion of area PD arranged between path P1 and path P0, that is, a portion of area PD forming a bottleneck emerging onto paths P1 and P0. This for example enables for all the charges photogenerated in area PD and conveyed, via this bottleneck, to paths P1 and P0, to be submitted to the electrostatic fields present in these paths P1 and P0. As an example, this bottleneck may be obtained due to dopant implantation areas and to the shape of these areas.

For example, to form path P1 so that this path holds the priority over path P0:

- the on-state resistance of the channel of transistor TG1 may be decreased, for example by widening the gate of transistor TG1; and/or
- the electric field along the channel of transistor TG1 may be increased, for example, by widening the implantation area of node NP1, that is, by increasing the voltage applied to node NP1, that is, voltage VRST, respectively VRT, when path P1 is a sampling, respectively, a reset, path; and/or
- the electric field along the channel of transistor TG1 may also be increased by adding dopants under the gate of transistor TG1 to form therein a potential gradient having a relatively strong slope as compared with the slope of a potential gradient in path P0; and/or
- the voltage applied to the gate of transistor TG1 to set it to the on state may be increased to increase the potential under the gate of transistor TG1.

For example, to form path P0 so that this path does not hold the priority over path P1:

- the dimensions, for example, the cross-section or the width, of path P0 may be decreased without for all this increasing the impedance of this path P0; and/or
- the electric field along path P0 can be decreased, for example either by decreasing the implantation area of node NPb, or by decreasing the voltage applied to node NPb, that is, voltage VRST, respectively VRT, when path P0 is a sampling, respectively reset, path; and/or
- the electric field along path P0 may also be decreased by adding dopants in path P0 to form therein a potential gradient having a relatively weak slope as compared with the slope of a potential gradient in path P1 when path P1 is conductive; and/or
- a gate biased to a fixed voltage may be arranged above path P0, the fixed bias voltage enabling to modulate the potentials in path P0.

Preferably, path P0 comprises no gate, which enables to decrease the bulk of path P0. Said in other words, the path P0 comprises no transistor. However, as an alternative, the path P0 may comprise a gate (thus a transistor), but which is then biased by a constant voltage and thus does not operate as a switch. The expression "constant bias voltage" here designates a bias voltage staying constant whatever the on or off state of the switch TG1 of the path P1. This gate biased by a constant voltage allows for controlling the electrostatic potential inside the path P0 so that the path P1 holds the priority over the path P0, meaning that all the charges flow inside path P1 when switch TG1 is on, and in the path P0 when the switch TG1 is off.

Figure 5:
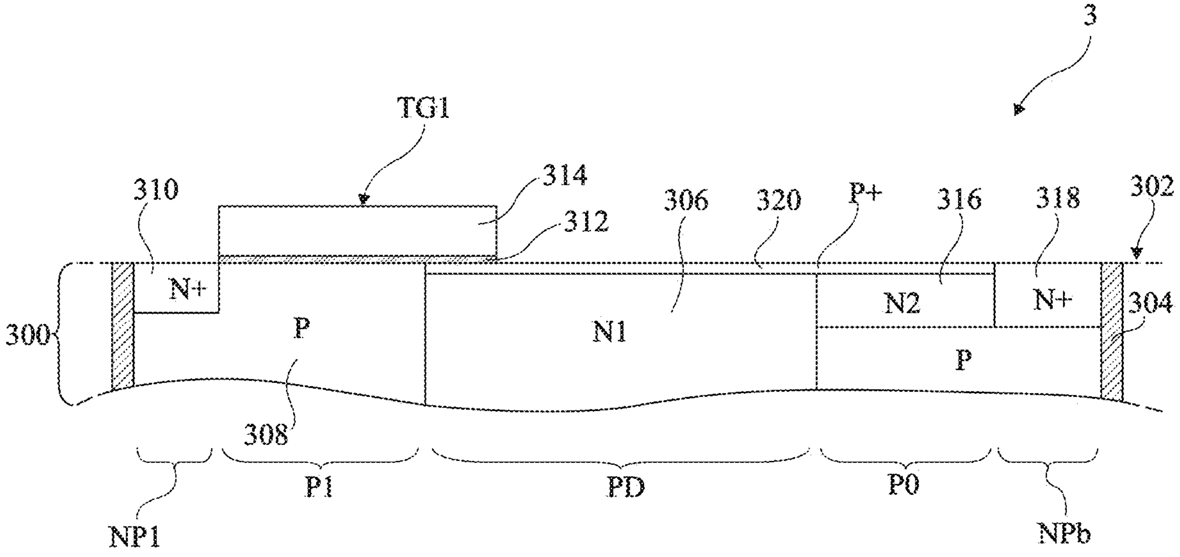
FIG. 5 is a simplified cross-section view illustrating an example of embodiment of the photosite of FIG. 3.

FIG. 5 is a simplified cross-section view illustrating an example of embodiment of the photosite of FIG. 3. More particularly, FIG. 5 shows an upper portion of a photosite 3 formed in a semiconductor substrate 300, for example, made of silicon, for example P-type doped to obtain a pinned photodiode. In other words, FIG. 5 shows an upper surface 302 of substrate 300 and of photosite 3, and a portion of photosite 3 formed under surface 302. FIG. 5 only shows paths P0 and P1, Nodes NP1 and NPb, and an upper portion of area PD. FIG. 5 is taken along a cross-section line running through node NP1, then path P1, then an upper portion of area PD, then path P0, and eventually node NPb.

Photosite 3 is for example laterally delimited by vertical insulation structures 304, for example, deep trench insulations (DTI) or capacitive deep trench insulations (CDTI, "Capacitive DTI").

Photosite 3 comprises, in a central portion, a doped well 306 of a first conductivity type, in this example, type N, with a first doping level N1. Although this is not shown in FIG. 5, this well 306 is in contact with an underlying doped region of the first conductivity type which extends for example under the entire surface 302 of photosite 3, all the way to structures 304. Preferably, the underlying region extends all the way to structures 304 but without passing under the flow paths. The assembly of this underlying region and of well 306 for example corresponds to area PD, well 306 corresponding, for example, to a bottleneck configured to take the charges photogenerated in area PD back to a central portion of the upper surface 302 of photosite 3.

A first edge of well 306 (on the left-hand side in FIG. 5) is bordered by path P1. For example, this first edge of well 306 is in contact with a channel-forming region, or body region, of transistor TG1. As an example, this channel-forming region is doped with the second conductivity type, in this example, type P.

Node NP1 is formed in portion 308. Node NP1 for example corresponds to a heavily-doped region 310 of the first conductivity type (N+). As an example, region 310 is flush with surface 302. In FIG. 5, region 310 extends laterally all the way to the edge of gate stack 312-314. Preferably, and although this does not appear in the drawing, region 310 slightly continues under gate stack 312-314.

Between region 310 and well 306, portion 308 is coated with the gate of transistor TG1, that is, with the gate stack of transistor TG1, this stack comprising a gate insulator 312 resting on surface 302 and a conductive gate electrode 314 resting on gate insulator 312.

As an example, the gate 312, 314 of transistor TG1 continues over well 306, to create a potential gradient in well N1 when transistor TG1 is switched to the on state.

A second edge of well 306 (on the right-hand side in FIG. 5), in this example opposite to the first edge of the well, is bordered with path P0.

In this example, path P0 corresponds to a doped region 316 of the first conductivity type, type N in this example, with a doping level N2 greater than level N1. Region 302 extends lengthwise between well 306 and node NPb, the latter for example corresponding to a heavily-doped region 318 of the first conductivity type (N+), flush with surface 302. The doping level of region 318 is greater than doping level N2.

Preferably, a heavily-doped layer 320 of the second conductivity type, that is, heavily P-type doped (P+) in this example, is formed over the entire surface 302 of photosite 3, except on regions 310 and 318 and under the gate 312, 314 of transistor TG1.

Those skilled in the art are capable of selecting the dimensions of gate 312, 314 and/or the voltage levels applied to gate 312, 314 and/or the dimensions of region 316 and/or doping levels N1 and N2 to obtain the previously-described operation of photosite 3.

Those skilled in the art are capable of implementing photosite 3 differently from what is illustrated in FIG. 5.

For example, path P0 may be implemented similarly to path P1, by providing for a gate to be arranged on surface 302, between well 306 and node NPb, region 316 being then preferably omitted and layer 320 interrupted under this gate. This gate is configured to be biased in fixed and constant fashion, to a voltage allowing the previously-described operation of photosite 3.

Figure 6:
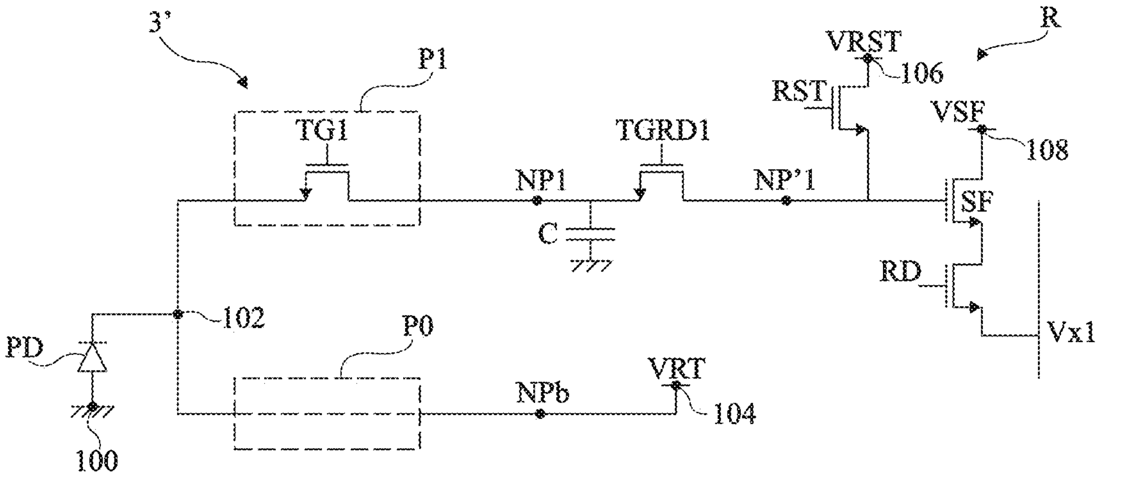
FIG. 6 illustrates an example of an alternative embodiment of the photosite of FIG. 3.

FIG. 6 illustrates an example of an alternative embodiment of the photosite of FIG. 3. More particularly, the photosite 3 described in relation with FIGS. 3 to 5 is configured to operate in the voltage domain, and the photosite 3' described in relation with FIG. 6 is configured to operate in the charge domain.

Only the differences between photosites 3 and 3' are here highlighted.

As compared with photosite 3, photosite 3' further comprises a capacitive element C connected to node NP1, and readout circuit R is not connected to node NP1, but coupled thereto by a switch or transistor TRGD1. For example, transistor TRGD1 has a conduction terminal connected to node NP1 and another conduction terminal connected to a node NP'1 of photosite 3', circuit R, for example, the gate of transistor SF, being connected to node NP'1. Capacitive element C is preferably a pinned capacitive area, for example, of CDTI type.

In the example of FIG. 6, path P1 is a sampling path and path P0 is a path for resetting area PD.

In another example not illustrated, path P1 is the path for resetting area PD and path P0 is the sampling path. In this other example, transistor TGRD1 is then connected between node NPb and node NP'1 to which circuit R is connected, node NP1 being coupled, preferably connected, to node 104 configured to receive potential VRT.

Figure 7:
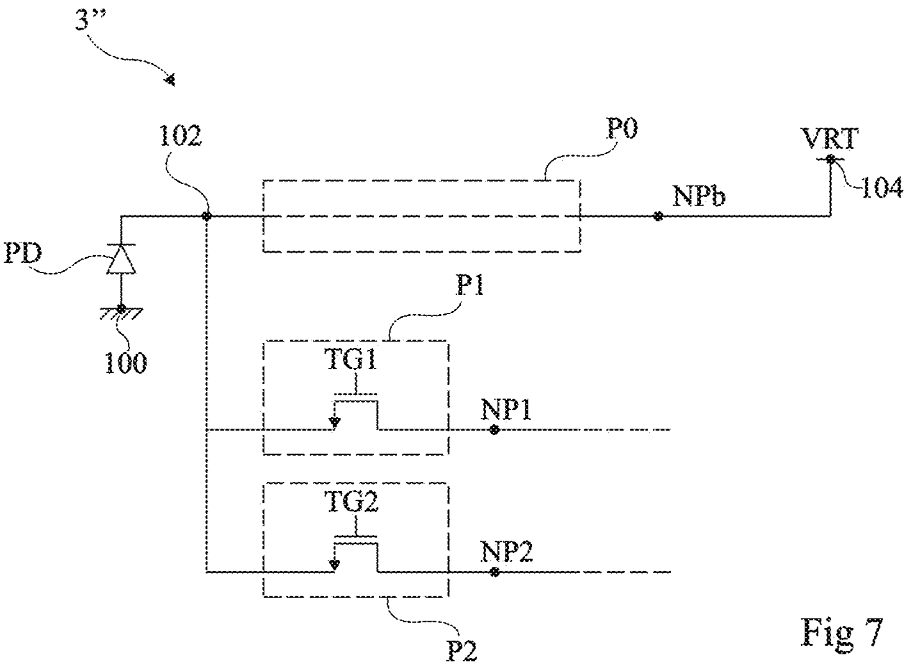
FIG. 7 illustrates an example of another alternative embodiment of the photosite of FIG. 3.

FIG. 7 illustrates an example of another alternative embodiment of a photosite 3" where path P0 is a path for resetting area PD. More particularly, photosite 3" differs from the previously-described photosites 3 and 3' in that it comprises K assemblies of a node NPj and of a sampling path Pj, j being an integer index having values in the range from 1 to K, and K an integer greater than or equal to 2 in this example while it was equal to 1 in the example of FIGS. 3 and 6.

In the example of FIG. 7, integer K is equal to 2, but those skilled in the art will be capable of adapting this example to the case where integer K is equal to 3 or 4.

Each path Pj (P1 and P2 in FIG. 7) comprises a switch or MOS transistor or transfer gate TGj (TG1 and TG2 in FIG. 7) coupling area PD, for example, node 102, to the corresponding node NPj (NP1 and NP2 in FIG. 7). For example, each switch TGj has a conduction terminal coupled, preferably connected, to node 102, and another conduction terminal coupled, preferably connected, to the corresponding node NPj.

In each path Pj, switch TGj is configured to allow the flowing of charges from area PD to the corresponding node NPj when this transistor TGj is on and to block any charge transfer between area PD and this node NPj when this transistor TGj is off.

Paths Pj and path P0 are configured so that each first path holds the priority over path P0 when this path Pj is in the conductive state, that is, when the switch TGj of this path Pj is on.

More particularly, paths Pj and P0 are configured so that all the charges of area PD are transferred to node NPb when all switches TGj are off, that is, when all paths Pj are blocked.

Further, paths Pj and P0 are configured so that all the charges of area PD are transferred to a given node NPj when the switch TGj of the corresponding path Pj is in the on state and the switches TGj of the other paths Pj are in the off state.

In photosite 3", due to the fact that path P0 is a path for resetting area PD, node NPb is coupled, preferably connected, to node 104 configured to receive the reset potential VRT of photodiode PD.

Further, all nodes NPj are coupled to a readout circuit (not shown) of photosite 3".

For example, in the case where photosite 3" is configured to operate in the voltage domain, all nodes NPj are connected to the readout circuit of photosite 3". As an example, when K is equal to 2 as in the example of FIG. 7, this readout circuit comprises a readout circuit R1 identical to that described in relation with FIG. 1 and a readout circuit R2 identical to that described in relation with FIG. 1, circuit R1, for example, the gate of transistor SF1, being connected to node NP1 and circuit R2, for example, the gate of transistor SF2, being connected to node NP2. Those skilled in the art are capable of adapting the above example of readout circuit to the case where K is equal to 3 or 4.

According to another example, in the case where photosite 3" is configured to operate in the charge domain, each node NPj is coupled to the readout circuit of photosite 3" by a distinct switch, and is further connected to a distinct capacitive element, preferably a pinned capacitive element, for example, of CDTI type, similarly to what has been described for the nodes N1 and N2 described in relation with FIG. 2. As an example, when K is equal to 2 as in the example of FIG. 7, similarly to the node N1, respectively N2, of FIG. 2, the node NP1, respectively NP2, of photosite 3" is connected to a conduction terminal of a switch or transistor TRGD1, respectively TRGD2, the other conduction terminal of this switch being connected to a node N1', respectively N2'. Nodes N1' and N2' are connected to the readout circuit, for example, to respective circuits R1 and R2 identically to what has been described in relation with FIG. 2. Those skilled in the art are capable of adapting the above example to the case where K is equal to 3 or 4.

According to an embodiment, there is provided a sensor comprising a plurality of depth pixels, each depth pixel being configured to acquire depth data and comprising one or a plurality of photosites such as previously described.

As an example, the sensor is only an iToF sensor and only comprises depth pixels, the latter being for example arranged in an array of rows and of columns of depth pixels. As an example, in such an iToF sensor, the photosites of the depth pixels of the sensor are arranged in rows and in columns of photosites.

According to another example, the sensor is a combined iToF and black and white sensor or a combined iToF and color sensor. In this case, the sensor for example comprises a color pixel array and a plurality of depth pixels interposed in the color pixel array. Each depth pixel comprises at least one photosite such as previously described, the photosites of the depth pixels being for example interposed in the color pixel array.

In a sensor comprising a plurality of depth pixels, each comprising at least one photosite such as described, the node NPb of a photosite may be connected to a node NPb of another photosite when the paths P0 of these two photosites are sampling paths, and the node NPj of a photosite may be connected to the nodes NPj of another photosite when the paths Pj of these two photosites are sampling paths.

Preferably, in a sensor comprising a plurality of photosites such as described in relation with FIGS. 3 to 7, all the photosites are identical to one another.

Various embodiments and variants have been described. Those skilled in the art will understand that certain features of these various embodiments and variants may be combined, and other variants will occur to those skilled in the art. In particular, the readout circuits of photosites 3, 3', and 3" are not limited to the examples of readout circuits described hereabove as an example, and those skilled in the art will be capable of providing different readout circuits.

Finally, the practical implementation of the described embodiments and variations is within the abilities of those skilled in the art based on the functional indications given hereabove. In particular, the implementation of the paths P0 and Pj of photosites 3, 3', and 3" is not limited to the example described in relation with FIG. 5.

The invention claimed is:

1. Photosite comprising:

a photoconversion area configured to convert light into photogenerated charges;

at least one assembly of a first node and of a first charge flow path, the first charge flow path comprising a first switch coupling the photoconversion area and the first node of said assembly, the first switch being configured to allow the flowing of photogenerated charges from the photoconversion area to the first node of said assembly via the first charge flow path of said assembly when said first switch is on and block the passage of photogenerated charges between the photoconversion area and the first node of said assembly when said first switch is off; and a second charge flow path between said photoconversion area and a second node of the photosite, the second charge flow path coupling the photoconversion area to the second node, wherein the first and second paths are configured so that each first path holds the priority over the second path when the first switch of said first path is on, wherein the second path comprises no switch between the photoconversion area and the second node, wherein the photoconversion area comprises a first semiconductor region, wherein, in each assembly, the first node of said assembly comprises a second semiconductor region and the first charge flow path of said assembly comprises a third semiconductor region between the first semiconductor region and the semiconductor region of the first node of said assembly, wherein the second node comprises a fourth semiconductor region, and wherein the second flow charge path comprises a fifth semiconductor region between the first semiconductor region and the fourth semiconductor region.

2. Photosite according to claim 1, wherein the second path comprises no transistor.

3. Photosite according to claim 1, wherein the second path comprises a transistor having a gate configured to receive a constant bias voltage.

4. Photosite according to claim 1, wherein the photosite comprises a single assembly of a first path and of a first node, the first and second paths being configured to transfer all the charges from the photoconversion area to the second node when the first switch is off.

5. Photosite according to claim 4, wherein the first and second paths are further configured to transfer all the charges from the photoconversion area to the first node when the first switch is on.

6. Photosite according to claim 4, wherein the photosite further comprises a readout circuit coupled to the first node.

7. Photosite according to claim 6, wherein the second node is configured to receive a potential for resetting the photoconversion area.

8. Photosite according to claim 4, wherein the photosite further comprises a readout circuit coupled to the second node.

9. Photosite according to claim 8, wherein the first node is configured to receive a potential for resetting the photoconversion area.

10. Photosite according to claim 1, wherein the photosite comprises a plurality of assemblies of a first path and of a first node, the first and second paths being configured to transfer all the charges from the photoconversion area to the second node when all the first switches are off.

11. Photosite according to claim 10, wherein the first and second paths are further configured to transfer all the charges from the photoconversion area to the first node of a given assembly when, among the first switches, only the first switch of said given assembly is on.

12. Photosite according to claim 10, wherein the photosite comprises a readout circuit coupled to each of the first nodes.

13. Photosite according to claim 12, wherein the second node is configured to receive a potential for resetting the photoconversion area.

14. Photosite according to claim 1, wherein the conversion area comprises a pinned photodiode.

15. Sensor comprising a plurality of depth pixels, each depth pixel comprising at least one photosite according to claim 1.

16. Sensor according to claim 15, wherein:

each photosite comprises a single assembly of a first path and of a first node, the first and second paths being configured to transfer all the charges from the photoconversion area to the second node when the first switch is off;

each photosite comprises a readout circuit coupled to its first node; and the first node of one of the photosites is connected to the first node of another one of the photosites.

17. Sensor according to claim 15, wherein:

each photosite comprises a plurality of assemblies of a first path and of a first node, the first and second paths being configured to transfer all the charges from the photoconversion area to the second node when all the first switches are off;

each photosite comprises a readout circuit coupled to each of its first nodes; and one of the first nodes of one of the photosites is connected to the corresponding first node of another one of the photosites.

18. Sensor according to claim 15, wherein:

each photosite comprises a single assembly of a first path and of a first node, the first and second paths being configured to transfer all the charges from the photo-conversion area to the second node when the first switch is off;

each photosite further comprises a readout circuit coupled to the second node; and the second node of one of the photosites is connected to the second node of another one of the photosites.

* * * * *